(12) United States Patent
Neyret

(10) Patent No.: US 11,108,221 B2
(45) Date of Patent: Aug. 31, 2021

(54) ELECTRIC PROTECTION SYSTEMS AND METHODS

(71) Applicant: Schneider Electric Industries SAS, Rueil Malmaison (FR)

(72) Inventor: Yannick Neyret, Biviers (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 0 days.

(21) Appl. No.: 16/830,586

(22) Filed: Mar. 26, 2020

(65) Prior Publication Data

US 2020/0321766 A1 Oct. 8, 2020

(30) Foreign Application Priority Data

Apr. 5, 2019 (FR) ...................... 1903678

(51) Int. Cl.
*H02H 7/00* (2006.01)
*H02H 1/00* (2006.01)
*H02H 7/26* (2006.01)

(52) U.S. Cl.
CPC ............ *H02H 1/0007* (2013.01); *H02H 7/26* (2013.01)

(58) Field of Classification Search
None
See application file for complete search history.

(56) References Cited

U.S. PATENT DOCUMENTS

| 9,588,563 | B2* | 3/2017 | Rathi | H02J 7/00 |
| 9,629,221 | B2* | 4/2017 | Saes | H05B 45/20 |
| 2016/0214454 | A1 | 7/2016 | Morita et al. | |
| 2016/0262232 | A1 | 9/2016 | Fukui et al. | |

FOREIGN PATENT DOCUMENTS

| DE | 102015110288 | 7/2016 |
| DE | 102016103090 | 9/2016 |

(Continued)

OTHER PUBLICATIONS

Search Report and Written Opinion for French Patent Application No. FR1903678 dated Feb. 12, 2020, 5 pages.

(Continued)

*Primary Examiner* — Stephen W Jackson
(74) *Attorney, Agent, or Firm* — Locke Lord LLP

(57) ABSTRACT

Electrical protection systems and methods, of which an exemplary method comprises:
  measuring a voltage and an electric current in an electric link;
  calculating, repeatedly, from the measured values of current, a first moving average and a second moving average, the second moving average being calculated over a duration longer than the first moving average;
  comparing the measured voltage value with a predefined voltage threshold value;
  comparing the current value of the first moving average with the current value of the second moving average; and
  identifying a condition of trigger of the protection device when the measured voltage value is lower than the predefined voltage threshold value for a duration longer than a predefined duration threshold and when the current value of the first moving average is higher than the current value of the second moving average.

13 Claims, 6 Drawing Sheets

(56) References Cited

FOREIGN PATENT DOCUMENTS

DE  102016213170  1/2018
EP  2527091  11/2012

OTHER PUBLICATIONS

English Language Machine Translation of German Patent Application Publication No. DE102016213170, published on Jan. 25, 2018, 21 pages.
English Language Machine Translation of European Patent Application Publication No. EP2527091, published on Nov. 28, 2012, 25 pages.

* cited by examiner

ELECTRIC PROTECTION SYSTEMS AND METHODS

TECHNICAL FIELD

The present invention relates to the field of electricity distribution grids and more particularly to microgrids or nanogrids.

BACKGROUND

Microgrids are generally used in residential, commercial or industrial buildings to produce and store electricity locally, while moreover being connected to a mains electricity distribution grid.

Microgrids especially facilitate the use of distributed energy sources, and more particularly the use of renewable energy sources, such as wind turbines, tidal stream generators or photovoltaic panels. Microgrids may also comprise energy storage devices such as batteries. Microgrids may advantageously be used to ensure a stable and continuous electricity supply when the mains grid is not reliable enough.

In practice, microgrids serve to electrically supply one or more electric loads that are protected by electric protection devices, such as circuit breakers or fuse-based disconnectors, whether they are remotely controlled or not.

Microgrids however have the drawback that it is difficult to manage electric faults when the microgrid is disconnected from the mains grid.

It is especially desirable to be able to rapidly isolate and locate the origin of an electric fault, without however affecting the electric supply of the rest of the microgrid.

Typically, when a microgrid is connected to the mains grid, the latter absorbs transient variations in load and ensures the amplitude and frequency stability of the electric voltage. In addition, in case of an electric fault of short-circuit or insulation-fault type, the over-current resulting from this fault has a value that is of high magnitude, for example about 10 to 20 times the value of the nominal current of the installation. The electric protection devices affected by the fault react automatically and rapidly, this allowing the portion of the microgrid in which the electric fault originated to be isolated, without affecting the operation of the rest of the microgrid.

However, when the mains grid is disconnected, such a behaviour is not guaranteed.

Conventionally, many microgrids include an engine-generator, in addition to energy storage systems and renewable energy sources, this having been satisfactory for a long time.

Generally, such an engine-generator comprises an internal combustion engine, such as a diesel engine, coupled to a rotating machine, such as an alternator.

In particular, when the microgrid is disconnected from the mains grid, the engine-generator allows the microgrid to be stabilized and, in case of an electric fault, plays a role comparable to that normally played by the mains grid, this allowing satisfactory processing of the electric fault to be ensured.

However, the use of diesel engine-generators in microgrids is sometimes no longer desired because of new environmental standards and increased regulatory constraints. It is then necessary to be able nonetheless to ensure a satisfactory behaviour of the microgrid in case of electric fault.

In practice, in the absence of an engine-generator, when the microgrid is disconnected from the mains grid, the electric supply is ensured by means of the inverters of the energy storage device and the renewable energy production devices, which however have a different behaviour from that of an alternator of an engine-generator, especially because the alternator, because of its construction, possesses a mechanical inertia that facilitates the stabilization of the microgrid in case of breakage and delivers a significant over-current in case of short-circuit.

In particular, energy sources such as solar panels are in general sources of current that are servocontrolled to the voltage of the voltage source, the voltage source then consisting, in such a microgrid, of the inverter of the storage device.

One problem is that in case of an electric fault, the inverter of the energy storage device can maintain the supply only for a very short duration, typically for at most a few seconds, before defaulting out and ceasing to supply the microgrid.

In addition, the over-current of the inverter has a magnitude very close to the magnitude of the nominal current, for example about 1.2 times the magnitude of the nominal current. This over-current is insufficient, in magnitude and duration, for it to be guaranteed that the most conventional electric protection devices, such as fuses or electromechanical circuit breakers, will actually be triggered.

There is therefore a risk that the protection devices will not be able to play their role and that the inverter will cease to supply the microgrid before the electric fault has been able to be localized and isolated. When the inverter is then rearmed, the fault will still be present and will again lead to a failure of the microgrid, this therefore considerably complicating the search for and the isolation of the fault by a maintenance team.

There is also a risk that, because of the high reaction time of protection devices in such circumstances, the electric fault will damage the microgrid and cause a fire to start.

The use of devices for protecting against voltage-dependent over-currents, such as protection devices of ANSI 51V type, is not always possible nor desirable in microgrids, on the one hand because of the high cost of implementation (because this often requires the addition of an electronic protection relay external to the circuit breakers) and on the other hand because of the complexity of their installation and of the parameterization thereof (because this requires adjustment of a plurality of additional parameters for each protection device, the calculation of specific protection plans, etc.) which require much more time and which demand a much more advanced or uncommon skill set on the part of the installers and of the design team in charge of installing and maintaining the microgrid.

SUMMARY

There is therefore a need for a solution allowing electric faults to be detected in an electric installation, especially in a microgrid and more particularly in a micro-grid devoid of a diesel engine-generator, that is reliable, inexpensive and easy to implement.

To this end, according to one aspect of the invention, a method is provided comprising the implementation, by an electronic monitoring module associated with an electric protection device, of steps consisting in:
- measuring, repeatedly, a voltage and an electric current in an electric link with which said electric protection device is associated;
- calculating, repeatedly, from the measured values of current, a first moving average and a second moving average, the second moving average being calculated over a duration longer than the first moving average;

comparing the measured voltage value with a predefined voltage threshold value;

comparing the current value of the first moving average with the current value of the second moving average;

identifying a condition of trigger of the protection device when the measured voltage value is lower than the predefined voltage threshold value for a duration longer than a predefined duration threshold and when the current value of the first moving average is higher than the current value of the second moving average.

The use of moving averages calculated from measured values of current allows an electric fault to be detected with a trigger threshold that automatically adapts to the operating conditions of the electric grid of which the electric link and the protection device form part.

By virtue of the invention, the detection of an electric fault is therefore carried out more reliably and in a way that is relatively simple to implement.

According to aspects that are advantageous but not obligatory, such a method may incorporate one or more of the following features, which may be implemented in isolation or in any technically acceptable combination:

The method furthermore comprises the emission, by the electronic monitoring module, of a warning signal when a trigger condition is identified.

The method comprises the emission, by the electronic monitoring module, of a trigger signal intended for the protection device when a trigger condition is identified.

The method furthermore comprises, when a trigger condition is identified, the storage in memory, by the electronic monitoring module, of a state variable indicating the presence of a trigger condition and, from the turn-on of the electronic monitoring module, a trigger condition being identified if the state variable stored in memory indicates the presence of a trigger condition.

When a trigger condition is identified, the method furthermore comprises steps consisting in waiting for a predefined duration then measuring again a value of the electric voltage, the trigger condition being inhibited if the measured value of the electric voltage is lower than the electric voltage threshold value.

The method furthermore comprises:

the acquisition of state information emitted by a second electronic monitoring module similar to said electronic monitoring module, this second electronic monitoring module being associated with a second protection device connected downstream of said protection device to the same electric link;

the inhibition of the trigger condition for said protection device if the acquired state information indicates that a trigger condition has been identified by the second electronic monitoring module for the second protection device.

The first moving average is calculated for a first duration shorter than or equal to 1 second, and preferably shorter than or equal to 500 ms and the second moving average is calculated for a second duration longer than the first duration, and preferably at least five times longer than the first duration, the second duration for example being shorter than or equal to 10 seconds, or shorter than or equal to 5 seconds.

According to another aspect, the invention relates to a system comprising an electric protection device and an electronic monitoring module associated with the electric protection device, the electronic monitoring module being programmed to implement steps consisting in:

measuring, repeatedly, a voltage and an electric current in an electric link with which said electric protection device is associated;

calculating, repeatedly, from the measured values of current, a first moving average and a second moving average, the second moving average being calculated over a duration longer than the first moving average;

comparing the measured voltage value with a predefined voltage threshold value;

comparing the current value of the first moving average with the current value of the second moving average;

identifying a condition of trigger of the protection device when the measured voltage value is lower than the predefined voltage threshold value for a duration longer than a predefined duration threshold and when the current value of the first moving average is higher than the current value of the second moving average.

According to aspects that are advantageous but not obligatory, such a system may incorporate one or more of the following features, which may be implemented in isolation or in any technically acceptable combination:

The electronic monitoring module is integrated into the protection device, which is for example implemented by an electronic tripping device of the protection device.

The electronic monitoring module is separate from the protection device and mounted outside the protection device.

According to yet another aspect, the invention relates to an electric grid, especially a microgrid, comprising:

an electricity storage device and/or an electricity generation device, supplying a main link;

at least one electric load, connected to the main link via a protection system such as described above.

BRIEF DESCRIPTION OF THE DRAWINGS

The invention will be better understood and other advantages thereof will become more clearly apparent in light of the following description of one embodiment of such a method, which description is given merely by way of example and with reference to the appended drawings, in which.

DETAILED DESCRIPTION

Figure 1:
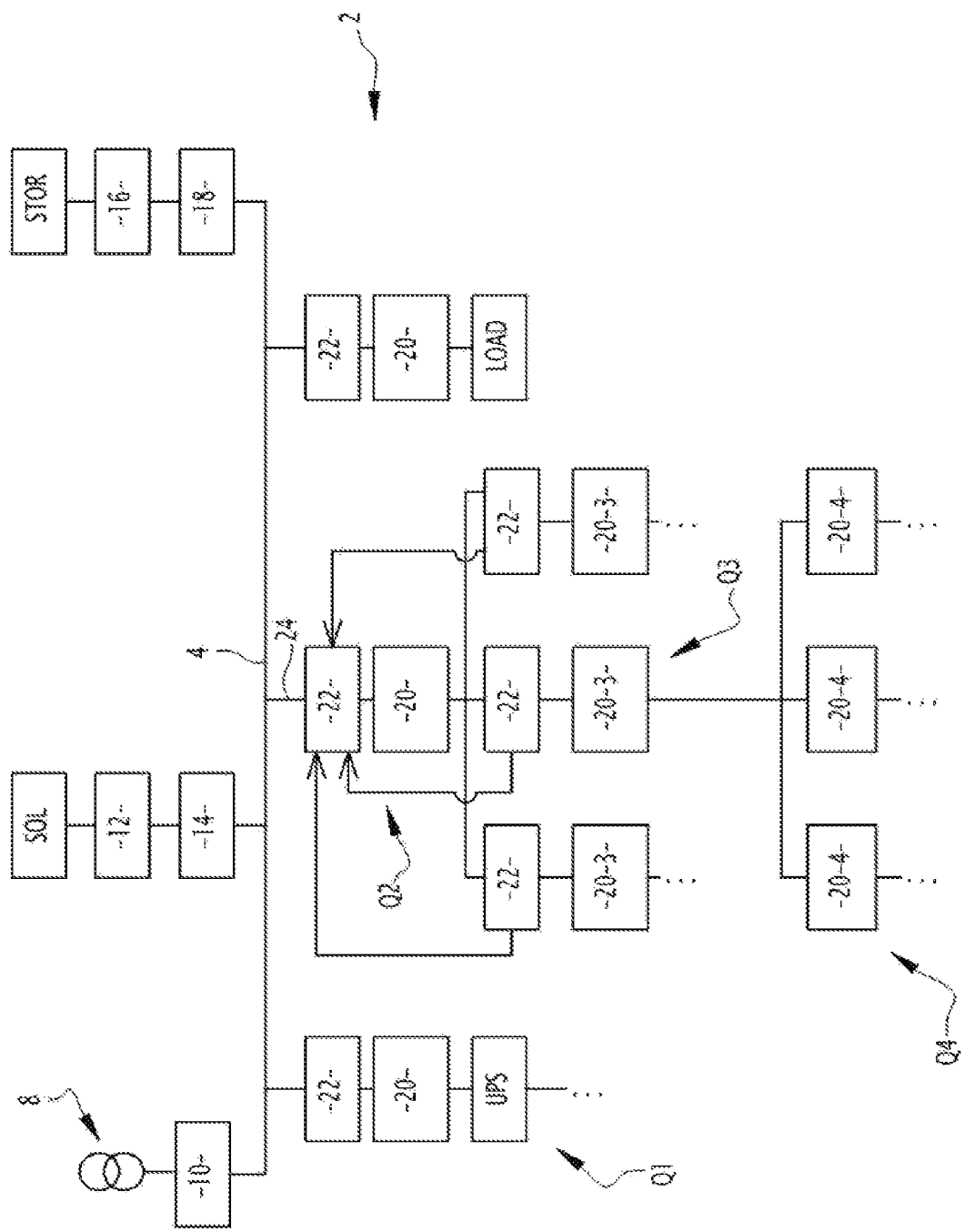
FIG. 1 is a schematic representation of an example of an electric distribution grid.

FIG. 1 schematically shows an example of an electric distribution grid 2, such as a microgrid.

The grid 2 comprises a main electric link 4 here connected to a main distribution grid 8, such as a mains electricity distribution grid, here via a protection device 10 such as a circuit breaker.

For example, the electric link 4 comprises electric conductors, such as the cables or bus bars of an electric switchboard.

The main grid 8 is able to deliver an electric supply and may be selectively disconnected from the grid 2.

According to examples, the grid 2 is installed in a residential, commercial or industrial installation.

The grid 2 comprises one or more electricity production devices, preferably renewable energy sources, such as wind turbines, tidal stream generators or photovoltaic panels, and one or more energy storage devices, such as electric batteries.

In the illustrated example, the grid 2 comprises:
a photovoltaic source SOL connected to the main link 4 via an inverter 12 and a protection device 14, and
an energy storage device STOR connected to the main link 4 via an inverter 16 and a protection device 18.

Preferably, the grid 2 is devoid of an engine-generator, such as a diesel engine-generator or, more generally, any electricity generator comprising a rotating machine, such as an alternator. In the case where such an engine-generator is physically present in the grid 2, the engine-generator is preferably disconnected from the grid 2 or kept in a stopped state.

The grid 2 also comprises one or more electric loads intended to be electrically powered by virtue of the electricity delivered by the main grid 8 and/or by the storage and/or production device.

The electric loads are connected to the main supply link 4 via electric protection devices 20, such as circuit breakers or fuse-based disconnectors, whether they are remotely controlled or not, or any equivalent protection device.

For example, each protection device 20 is, in a known way, configured to switch the flow of electric current in an electric link of the grid 2, when the electric current flowing therethrough is higher than a trigger threshold according to the prior art.

In particular, each protection device is switchable between an electrically open state, preventing the flow of the current, and an electrically closed state, permitting the flow of the current.

According to examples of implementation, the protection device 20 is in electromechanical technology and may comprise separable electric contacts, or any other electric breaking means, which may be switchable by means of a controllable actuator, an electromagnetic actuator for example.

The grid 2 also comprises electronic monitoring modules 22 associated with one or more protection devices 20 and the role of which is described in more detail below.

In the illustrated example, a first group of electric loads, such as loads of critical importance, designated by the reference Q1, are connected to the main supply link 4 for example via an uninterruptible power supply UPS and a first protection device 20 equipped with a monitoring module 22.

A second group of electric loads LOAD is connected to the main supply link 4 via a second protection device 20 equipped with a monitoring module 22.

A third group of electric loads is connected to the main supply link 4 via a plurality of protection devices 20 that are mounted in cascade, here by means of secondary supply links that are connected in parallel and for example arranged in a hierarchized way.

For example, the reference 24 designates the secondary supply link with which a head protection device 20 is associated, said device here being designated by the reference Q2 and forming a first level of the hierarchy of the microgrid 2.

Downstream of the head protection device 20, the secondary supply link 24 is shared between three branches each comprising one protection device 20 and a monitoring module 22 associated with one protection device 20, here forming a second level.

In FIG. 1, the protection devices 20 of the second level have been designated by the reference "20-3" and one thereof has here been designated with the reference Q3.

One or more electric loads may be directly or indirectly connected downstream of the protection devices of the level Q3.

Again in the illustrated example, one of these branches is, downstream of its protection device 20, itself subdivided into three other branches to which are connected, for each thereof, one or more electric loads via a protection device 20, which here comprises no monitoring module 22, defining a third level.

In FIG. 1, the protection devices 20 of the third level have been designated by the reference "20-4" and one thereof has here been designated by the reference Q4.

To make FIG. 1 easier to read, the electric loads have not all been illustrated and the masked segments of the grid 2 have been schematically represented by dots.

It will be understood that the grid 2 described with reference to FIG. 1 is given by way of not necessarily limiting example and, as a variant, the grid 2 could be different, and for example could have a different architecture and/or a different topology and/or comprise electric loads and/or production devices and/or storage devices differing in their nature and/or their number and/or their arrangement in the grid 2. However, the invention firstly relates to applications in which the energy sources are connected to the supply link 4 and are not placed downstream of protection devices 20.

According to certain modes of implementation, as in the illustrated example, the protection devices 20 are not all equipped with a monitoring module 22.

In practice, in preferred variants, only protection devices 20 the current rating $I_n$ of which is higher than or equal to about $\frac{1}{10}$ of the nominal electric current of the inverter 16 of the energy storage device are equipped with a monitoring module 22.

Figure 2:
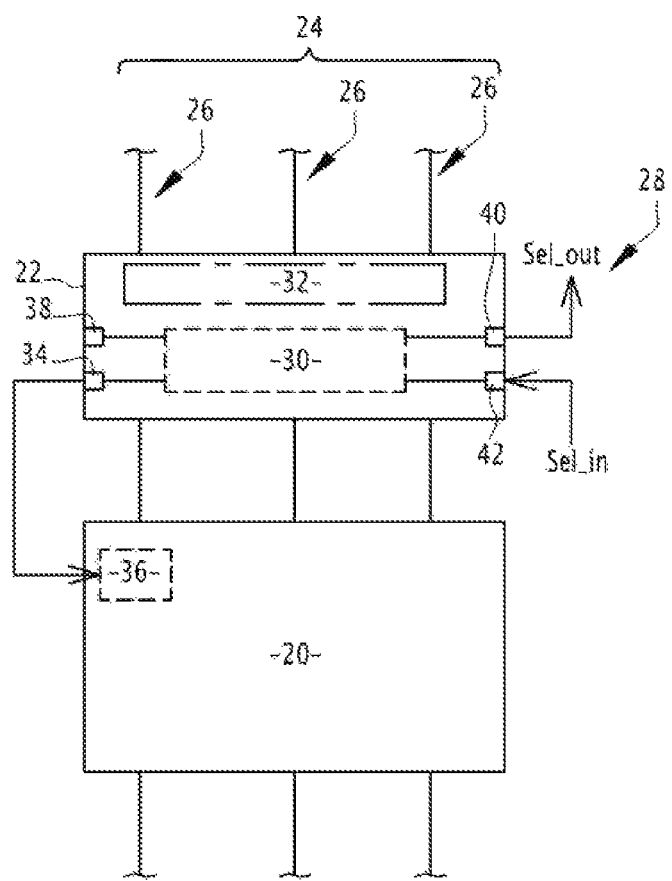
FIG. 2 is a schematic representation of an electronic monitoring module according to embodiments of the invention, associated with an electric protection device of the grid in FIG. 1.

FIG. 2 shows one of the monitoring modules 22 associated with one of the protection devices 20, for example mounted on the electric supply link to which the protection device 20 is connected.

In the illustrated example, the supply link 24 is a three-phase link and comprises three electric conductors 26 each associated with one electric phase.

According to other variants (not illustrated) the embodiments described below are generalizable to other types of grid, such as single-phase two-conductor (neutral and phase) grids, two-phase two-conductor (two phases) grids or three-conductor (two phases and neutral) grids, or even three-phase four-conductor (three phases and neutral) grids.

The protection device 20 is thus suitable for switching a three-phase electric current flowing in these conductors 26.

The reference 28 designates the system formed by the association of the protection device 20 and of the monitoring module 22.

For example, the monitoring modules 22 of the grid 2 are similar or identical to one another and operate similarly.

The monitoring module 22 comprises an electronic processing unit 30, a set of sensors 32 for measuring values of electric current and of electric voltage in the supply link 24, and a communication interface.

According to modes of implementation, the electronic processing unit 30 comprises a computational logic unit, such as a programmable microcontroller or a microprocessor, and a computer memory forming a computer-readable data storage medium.

For example, the memory is a ROM, a RAM or a nonvolatile memory such as an EPROM, an EEPROM, a FLASH memory or an NVRAM or an optical or magnetic memory.

The memory here comprises executable instructions or modules of software code, which are preferably suitable for implementing a detection method such as described in the following examples when these instructions are executed by the computational logic unit.

As a variant, the electronic processing unit 30 comprises a programmable logic component such as an FPGA or a dedicated integrated circuit such as an ASIC configured to implement the detection method.

According to modes of implementation, the sensors 32 allow the magnitude of the electric current flowing in the supply link with which the monitoring module 22 is associated to be measured, for example in order to measure the magnitude of the current in each of the phase lines 26.

The sensors 32 also allow the electric voltage across two phases lines 26 and/or on one or more individual phase lines 26, for example with respect to a reference electric potential, to be measured.

For example, the set of sensors 32 comprises one or more sensors of current and one or more sensors of voltage. The sensors of current may include a Rogowski coil, or a current transformer, or a hall-effect sensor, or a shunt. The voltage sensors the voltage sensors may include, inter alia, a shunt, a voltage transformer or a capacitive sensor.

The communication interface for example comprises a first output 34 for sending a trigger control signal to the protection device 20, and for example to the actuator 36 or to a tripping device of the protection device 20, especially in order to switch the protection device 20 to an open state in case of detection of an electric fault.

Advantageously, the monitoring module 22 is also connected to the protection device 20 in order to determine the open or closed state of the protection device 20.

According to examples, the communication interface also comprises a second output 38 for sending a warning signal, especially to a user.

For example, the second output 38 includes a connector or a dry contact for controlling a remote piece of equipment such as a relay, or an indicator light or a sounder directly connected to the second output 38.

As a variant, the communication interface may incorporate a communication device capable of sending such a warning signal, such as an indicator light or a sounder, or an electronic human-machine-interface device for example comprising a display screen.

According to other variants, the second output 38 comprises a radiofrequency interface for sending the warning signal over a radio communication link, a long-range link for example.

According to possibilities of implementation, as illustrated in FIG. 2, the monitoring module 22 is separate from the protection device 20, i.e. it is a question of an element that is dissociable from and independent of the protection device 20. The monitoring module 22 is here mounted outside the protection device 20.

According to other possibilities of implementation, the monitoring module 22 is integrated into the protection device 20. For example, the monitoring module 22 may be an element that is separate from and independent of the protection device 20 while being housed inside a casing of the protection device 20.

As a variant, the monitoring module 22 is implemented, for example in software form, by an electronic control unit, such as an electronic tripping device, belonging to the protection device 20.

In this case, the monitoring module 22 does not necessarily possess a communication interface or input/outputs that are specific thereto, but may instead use a communication interface or input/outputs of the electronic control unit of the protection device 20.

Generally, each of the monitoring modules 22 is programmed to implement steps consisting in:

measuring an electric voltage and an electric current in the electric link 24 with which the protection device 20 with which the monitoring module 22 is associated is associated;

calculating from the measured values of current, a first moving average, called the short average, and a second moving average, called the long average;

comparing the measured voltage value with a predefined voltage threshold value;

comparing the current value of the first moving average with the current value of the second moving average;

identifying a condition of trigger of the protection device 20 when the measured voltage value is lower than the predefined voltage threshold value for a duration longer than a predefined duration threshold and when the current value of the first moving average is higher than or equal to the current value of the second moving average.

The steps of measuring, of calculating and of comparing are for example carried out repeatedly over time, and for example repeated periodically. Thus, it will be understood that the first and second moving averages are constructed from a plurality of measurements of current that are carried out at a plurality of instants over time.

For example, comparisons of the current and of the voltage may be carried out for each phase line or for a plurality of phase lines.

According to one example, on the one hand the voltage is compared with said threshold for one phase line and on the other hand the moving averages calculated from the measured current are compared for the same phase line.

According to another example, the voltage formed between two phase lines is compared with said threshold and the moving averages are compared to detect an increase in the current on these two phase lines.

In practice, the trigger condition indicates the presence of an electric fault of short circuit or insulation-fault type.

According to modes of implementation, once the trigger condition has been identified, one or more actions may be taken by the monitoring module 22 with a view to remedying the cause of appearance of the fault, such actions including sending a trigger signal, for example by means of the output 34, and/or sending a warning signal, for example by means of the output 38 or any suitable element of the communication interface.

Advantageously, the presence of a trigger condition is recorded in the memory of the unit 30, for example in the form of a first state variable.

For example, the first state variable may take a first value (inactive state) indicating the absence of a trigger condition or a second value (active state) indicating the presence of a trigger condition.

In practice, the first moving average is calculated from a first sample of values of current, which values are accumulated during a first duration. The second moving average is calculated from a second sample of values of currents, which values are accumulated during a second duration longer than the first duration. In other words, the second moving average is calculated over a longer duration than the first moving average.

Advantageously, the first duration is shorter than or equal to 1 second, or shorter than or equal to 500 ms (milliseconds), and preferably shorter than or equal to 200 ms, or even equal to 100 ms. The second duration is at least five times longer than the first duration, while preferably for example being shorter than or equal to 10 seconds, or shorter than or equal to 5 seconds.

According to examples, the first moving average is an exponential moving average. The second moving averages an arithmetic average.

As a variant, the first and second moving averages may be chosen differently.

The use of moving average is calculated from measured values of current allows an electric fault to be detected with a trigger threshold that automatically adapts to the operating conditions of the electric grid 2.

By virtue of the invention, an electric fault is therefore detected more reliably and in a way that is relatively simple to implement.

According to optional modes of implementation, when a trigger condition is identified, the monitoring module 22 waits for a predefined duration (here denoted T4) then measures again a value of the electric voltage, the trigger condition being inhibited if the measured value of the electric voltage has again become higher than the electric voltage threshold value.

This delay makes it possible to avoid triggering the protection device 20 if the electric voltage has in the meantime returned to a nominal amplitude, this decreasing the risk of false positives.

In advantageous but nevertheless optional embodiments, the monitoring module 22 comprises an output 40 and an input 42 that are intended to be connected to other monitoring modules 22, for example when a plurality of protection devices 20 are installed in cascade.

This especially allows the electric fault to be isolated in the right level between a plurality of breaking devices connected in cascade within the grid 2.

For example, the output 40 delivers a signal denoted Sel_out to a monitoring module 22 associated with an upstream protection device 20. The input 42 receives a signal denoted Sel_in originating from one or more monitoring modules 22 associated with one or more protection devices 20 installed downstream.

In the example of FIG. 1, the outputs 40 of the monitoring modules 22 of the level Q3 are connected to the input 42 of the monitoring module 22 of the level Q2 located upstream.

For example, when a plurality of downstream monitoring modules 22 are connected downstream of a monitoring module 22, said downstream modules are connected in parallel, so that the input 42 can receive a signal Sel_in when one or more of the downstream monitoring modules 22 emits a corresponding signal.

Advantageously but nevertheless optionally, the monitoring module 22 may preserve in memory information representative of the state of the one or more downstream monitoring modules 22 connected to the input 42, for example in the form of a second state variable.

For example, the second state variable may take a first state corresponding to the absence of signal Sel_in on the input 42, indicating the absence of a trigger condition in the downstream modules 22, and a second state corresponding to the presence of a signal Sel_in received on the input 42, indicating the presence of a trigger condition in one of the downstream modules 22.

Thus, according to modes of implementation including such a management of selectivity, the method may furthermore comprise:
  acquiring state information emitted by a downstream second monitoring module 22 associated with a second protection device 20 connected downstream of said protection device 20;
  inhibiting the trigger condition for said protection device 20 if the acquired state information indicates that a trigger condition has been identified by the second monitoring module 22 for the second protection device 20.

This makes it possible to not trigger a protection device 20 located upstream when the fault has already been detected by one of the downstream protection devices 20. Thus neutralization of the electric supply of the branches of the grid 2 that are not concerned by the electric fault is avoided.

According to examples of implementation, when the delay applying the waiting time T4 is used in a plurality of monitoring modules 22 associated with protection devices 20 mounted in cascade, the waiting time is preferably shorter for the monitoring modules located downstream than for the monitoring modules located upstream. For example, for the monitoring modules 22 of the level Q2, the waiting time T4 is equal to 300 ms and, for the monitoring modules 22 of the level Q3, the waiting time is equal to 200 ms.

This especially makes it possible to ensure a selectivity in the trigger of breaking devices connected in cascade within the grid 2, for example in the same branch of the grid 2 stemming from the link 24.

Figure 3:
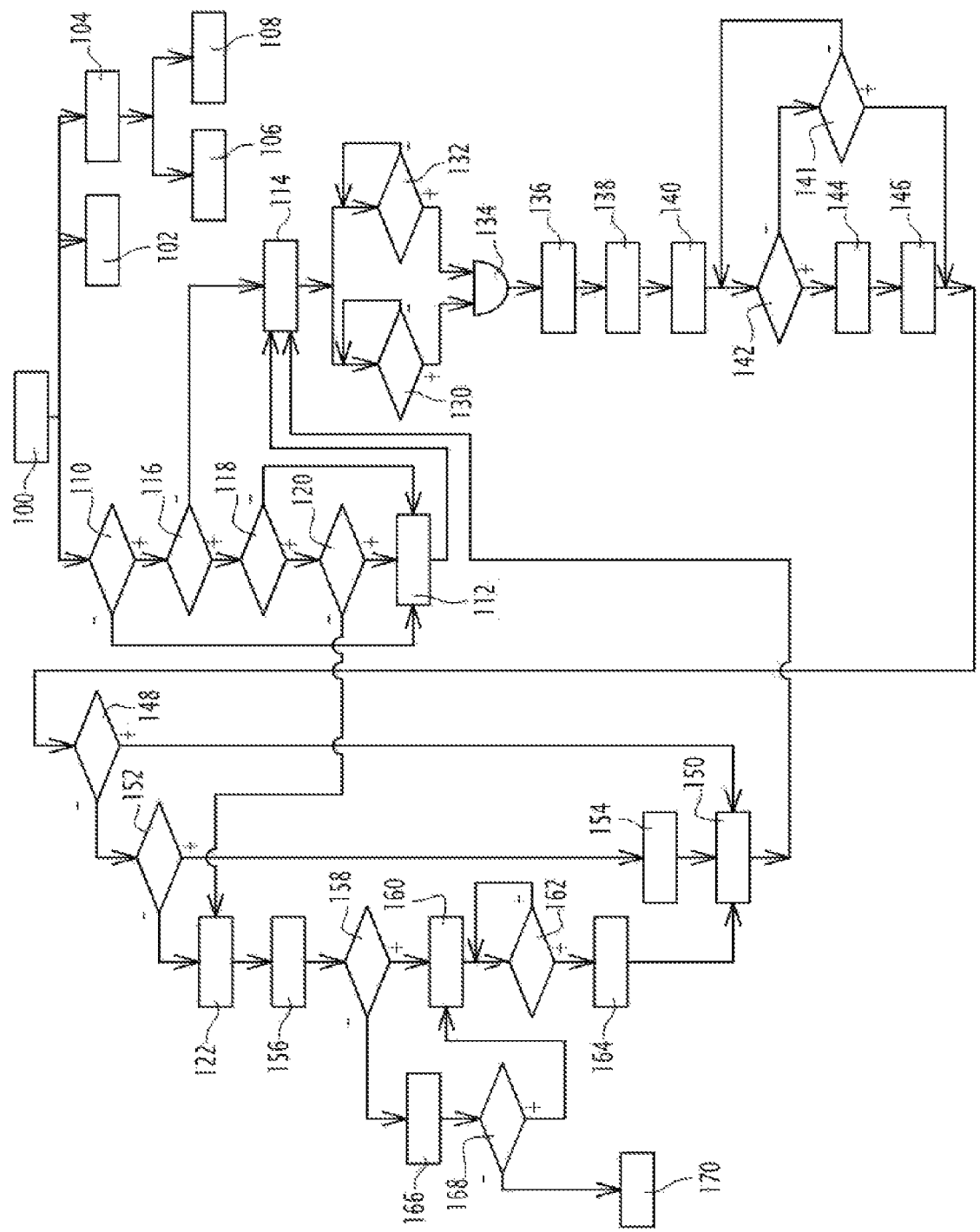
FIG. 3 is a flowchart of an example of a method of operation of the electronic monitoring module of FIG. 2 according to a first embodiment.

FIG. 3 now shows an example of operation of the monitoring module 22 according to a first embodiment.

This first embodiment may in particular be advantageously used in the case where a plurality of monitoring modules 22 are associated with protection devices 20 connected in cascade, such as the protection devices of the groups Q2 and Q3 identified in FIG. 1, even though other uses are possible.

In step 100, the monitoring module 22 is turned on.

The measurements of electric voltage are carried out by the sensors 32 in a step 102 that is repeated over time. In parallel, the measurements of current are carried out by the sensors 32 in a step 104 that itself is also repeated over time.

As the measurements of current and voltage are repeated, the first moving average is calculated in a step 106 and the second moving average is calculated in a step 108.

For example, the calculation is carried out automatically by the unit 30 and the calculated current values of the first and second moving averages are stored in the memory of the unit 30.

According to optional embodiments, in parallel, the monitoring unit 22 implements, immediately after its turn-on, one or more diagnosing steps.

For example, in a step 110, the unit 22 determines whether the protection device 20 is in an open state and, if such is the case, then the first state variable is reset to the first value in a step 112.

Where appropriate, in a step 114, the second state variable is reset to indicate the absence of trigger condition in the downstream modules.

In the case where the protection device 20 is identified as being in a closed state, then, in a step 116, the module 22 checks whether the first state variable is in the first state.

If this is not the case, then step 114 is implemented.

If the first state variable is equal to the first value, then, in a step 118, the measured voltage is compared to a first predefined voltage threshold, this threshold for example being equal to 70% of the nominal electric voltage for an adjustable minimum time, for example at least 50 ms.

If the measured voltage is higher than the first threshold, then step 112 is implemented.

If the measured voltage is lower than the first threshold, then a step 120 is implemented, in which the module 22 checks whether the second state variable is in the second state. If such is the case, the method passes to step 112.

In the contrary case, i.e. if the second state variable is equal to the second value indicating an absence of trigger condition downstream, then a trigger condition is identified.

Therefore, in this example, in a step 122, a trigger signal is sent by the module 22 in order to switch the protection device 20 to the open state.

As a variant, step 118 may be omitted, the method passing directly to step 120.

In this first embodiment, following step 114, in a step 130 that is repeated over time, the measured voltage value is compared with a predefined voltage threshold in order to determine whether the measured voltage value is lower than the predefined voltage threshold value for a first duration t1 longer than a predefined duration threshold.

For example, this voltage threshold is the same as the first predefined threshold described above. The first duration is here longer than or equal to an adjustable duration, for example is set equal to 50 ms.

In parallel, in a step 132 that is repeated over time, the respective current values of the first and second moving averages are compared to each other in order to determine whether the current value of the first (short) moving average has become higher (optionally with a predefined margin) than the current value of the second (long) moving average.

If the result of the two comparisons carried out in step 130 and step 132 is positive, then a trigger condition is identified in step 134.

In the contrary case, steps 102, 104, 106, 108, 130 and 132 continue to be repeated until the end of the method.

Advantageously, in a step 136, the presence of the fault is stored in memory. For example, the first state variable becomes equal to the second value.

Next, in a step 138, the module 22 emits a state signal indicating the presence of the trigger condition. For example, the signal Sel_out is transmitted via the output 40 to, where appropriate, the one or more monitoring modules 22 connected upstream.

Preferably, in a step 140, the module 22 starts counting down the predefined duration T4, for example by means of a clock of the circuit 30.

In a step 142, the monitoring module 22 checks the state of the input 42 especially in order to detect state information emitted by a downstream monitoring module 22 indicating that a protection device 20 connected downstream is in a trigger condition. For example, in step 142, the module 22 detects that the signal Sel_in received on the input 42 has a high value.

In this case, in a step 144, the second state variable is changed to the second value in order to indicate the presence of a trigger condition downstream of the protection device 20. Next, in a step 146, the first state variable is reset to its first value, since the electric fault has already been detected by a protection device located downstream.

In the case where no state information has been received by the end of step 142, then a step 141 is implemented to check whether the delay T4 has reached its end, i.e. whether the countdown of the duration T4 initiated in step 140 has ended. If this is not the case, step 142 is implemented again.

On the expiry of the predefined duration T4, in a step 148, the module 22 automatically checks whether the measured electric voltage is still lower than (or equal to) the electric voltage threshold value.

If not, i.e. if the measured value of the electric voltage has again become higher than the electric voltage threshold value, then the trigger condition is inhibited and, in a step 150, the module 22 ceases to emit a state signal indicating the presence of the trigger condition. The method restarts with step 114.

If yes, i.e. the measured value of the electric voltage has remained lower than (or equal to) the electric voltage threshold value, in a step 152, the module 22 checks whether the second state variable is equal to the second value. In other words, the module 22 checks whether the second state variable indicates the presence of a trigger condition downstream.

If such is the case, then the trigger condition is once again inhibited, since even though the voltage has not returned to a normal level, a fault has already been detected by a module located downstream. A step 154 is then implemented, in which a waiting time T5 is counted down. Then the method passes to the step 150 that was described above. For example, the waiting time T5 is equal to 50 ms.

This delay makes it possible to give the downstream monitoring module enough time to trigger the corresponding downstream protection device.

The indication of the presence of the fault is nevertheless kept in memory during this time in case the electric supply of the grid 2 is interrupted before the protection device 20 has had the time to be opened.

Generally, the use of the first state variable and/or of the second state variable, although optional, is nevertheless advantageous because it allows information relating to the detection of a fault by the module 22 or by a downstream module to be to be kept in memory even when the electric supply of the grid 2 is interrupted prematurely in particular because of a fault in the inverter 16.

If such an interruption occurs, the module 22 may nonetheless process the electric fault as soon as it is turned back on once the electric supply is re-established, by virtue of the information stored in the nonvolatile memory of the circuit 30 and in particular by virtue of the diagnosing steps 116, 118 and 120 described above.

At the end of step 152, if the module 22 has detected no trigger conditions downstream, then, in a step 122 that has already been described above, a trigger signal is sent to switch the device 20 to the open state.

Advantageously, in a step 156, a warning signal is also emitted, for example using the communication interface described above.

In step 158, the module 22 checks whether the protection device 20 is in the open state. If yes, in a step 160, the first state variable is reset to the first value indicating the absence of faults. Specifically, at this stage, storage in memory is no longer necessary since a corrective action has been taken via steps 156 and 158.

Optionally, in step 162, the module 22 checks whether the protection device 20 has been closed, for example following a manual rearming and re-closing operation carried out by an operator. Until the protection device 20 is closed, step 162 is repeated.

Once the protection device 20 is detected as having been closed, then, in a step 164, the module 22 resets the warning signal. For example, the light signal is turned off, or the audio signal ceases to be emitted, or radio frames cease to be sent. The method then passes to step 150 described above.

Optionally, at the end of step 158, if the module 22 detects that the protection device 20 has not opened, then the module 22 again sends a control signal (step 166) then again checks whether the protection device 20 is in the open state (step 168). If yes, the method passes to step 160. If not, the module 22 sends an error signal (step 170), for example using the communication interface, in order to indicate a failure of the protection device 20.

Figure 4:
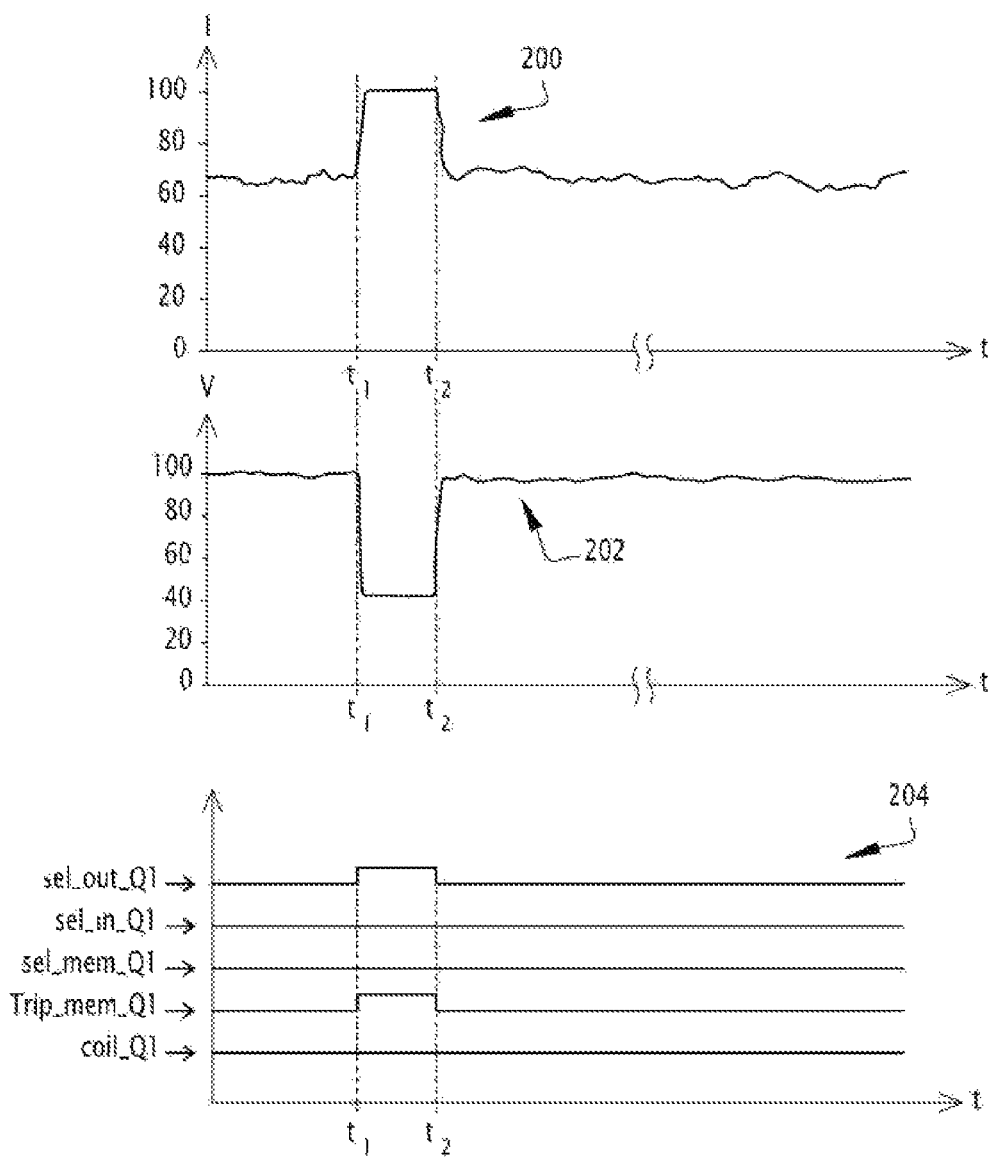
FIG. 4 is a timing diagram of a first example of operation of the electronic monitoring module of FIG. 2.

FIG. 4 shows a timing diagram illustrating another example of operation of the method described above, implemented for the monitoring module 22 and the protection device 20 of the branch Q1 of the grid 2.

The curves 200 and 202 respectively show the variation in the amplitude of the current I (expressed in amperes) and of the voltage V (expressed in percent relative to the nominal value) as a function of time t (arbitrary units) for the electric link on which the protection device 20 is mounted.

In the illustrated example, an electric fault occurs at a time $t_1$ and disappears at a subsequent time $t_2$. The current I remains relatively constant as a function of time except between the times $t_1$ and $t_2$ where its amplitude greatly increases. In parallel, the average amplitude of the voltage V remains relatively constant, except that it decreases between the times $t_1$ and $t_2$. Thus, a trigger condition is identified by the module 22 at the time $t_1$.

The graph 204 shows the variation in the state of memories and of state signals within the module 22 as a function of time t. They are here illustrated as being able to take a low value (indicating an inactive state) and a high value (indicating an active state) although in practice other implementations are possible.

In this example, the countdown of the duration T4 here starts at the time $t_1$. The disappearance of the fault at the time $t_2$ occurs before the expiry of the waiting time T4.

The signal "Sel_out_Q1" indicating the state information delivered on the output 40 is here activated at the time $t_1$, and ends at the time $t_2$. The first state variable "Trip_mem_Q1" passes to the active state at the time $t_1$ and passes back to the inactive state at the time $t_2$.

As the monitoring module 22 is connected to no downstream modules in the branch Q1, the signal "sel_in_Q1" indicating the state of the input 40 and the second state variable "sel_mem_Q1" remain inactive.

In practice, step 142 is continuously implemented from the start of the countdown and without necessarily waiting for the end of the waiting time T4 at the end of step 140.

Since the electric voltage has returned to a normal value before the expiry of the waiting time T4, then the protection device 20 is not triggered. The control signal "coil_Q1" therefore remains inactive.

Figure 5:
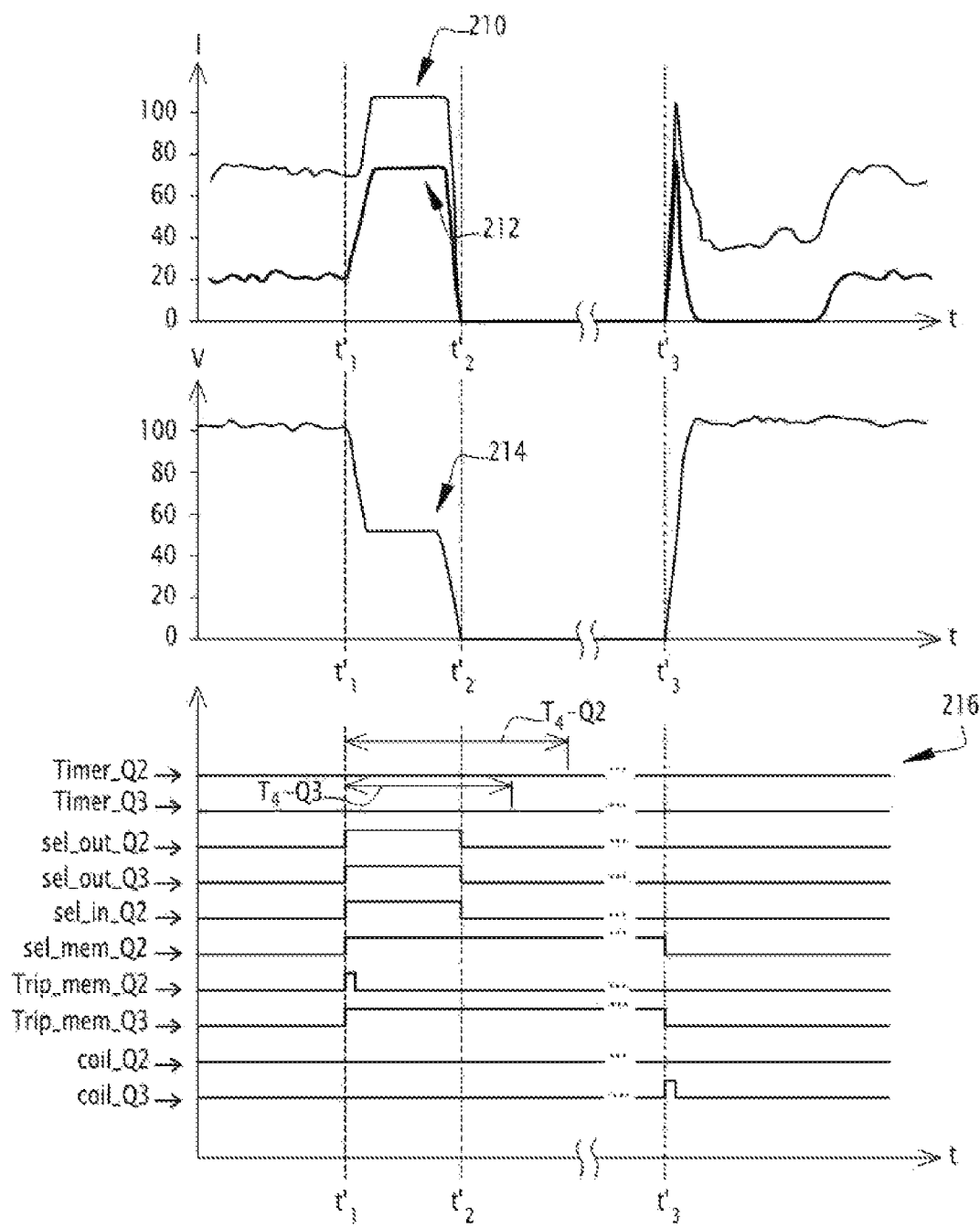
FIG. 5 is a timing diagram of a second example of operation of the electronic monitoring module of FIG. 2.

FIG. 5 shows a timing diagram illustrating another example of the operation of the method described above, implemented by the monitoring modules 22 of the protection devices 20-3 and 20-4 of the grid 2.

The curves 210 and 212 show the variation in the amplitude of the current I, expressed in amperes, as a function of time t (arbitrary units) for the protection device Q2 and for one of the protection devices 20-3 of the second level, respectively. The curve 214 shows the variation in the voltage V, expressed in percent relative to the nominal value, as a function of time t.

In the illustrated example, an electric fault occurs at a time $t'_1$ in the level Q3 downstream of the protection device Q2. The electric supply of the grid 2 is interrupted at the subsequent time $t'_2$ because of a failure of the inverter 16. At the time $t'_3$ the inverter is rearmed by an operator.

Thus, the amplitudes of the currents increase from the time $t'_1$ and drop to zero after the time $t'_2$ before abruptly increasing again from the time $t'_3$. The amplitude of the voltage V decreases by half at the time $t'1$ then remains stable before dropping to zero at the time $t'_2$ then abruptly increases at the time $t'_3$.

The graph 216 shows the variation in the state of memories and of state signals within the module 22 as a function of time t. They are here illustrated as being able to take a low value (indicating an inactive state) and a high value (indicating an active state) although in practice other implementations are possible.

In this example, the symbol Q2 or Q3 in the name of the signal indicates that this signal relates to the monitoring module 22 placed upstream (device Q2) or downstream (device Q3), respectively.

The lines "Timer_Q2" and "Timer_Q3" indicate the start and end of the countdown implemented in step 140. The countdown here starts at the time $t'1$ and ends at different times for the two modules, since the duration T4 (denoted T4-Q3) of the downstream module 22 is preferably chosen to be shorter than the duration T4 (denoted T4-Q2) of the upstream module 22. In this example, the time $t'_3$ is in any case subsequent to the expiry of the two waiting times T4.

The signals "Sel_out_Q2" and "Sel_out_Q3" indicating the state information delivered on the output 40 of the corresponding module 22 are both activated at the time $t'_1$ and deactivated at the time $t'_2$ following the interruption of the supply. The signal "Sel_in_Q2" corresponds to the signal "Sel_out_Q3" emitted by the downstream module 23 and received on the input 40 of the upstream module 22.

The second state variable "sel_mem_Q2" of the downstream module is activated shortly after the time $t'_1$ following step 146. By virtue of the storage in the nonvolatile memory, the second state variable is kept even during the interruption of the electric supply.

Analogously, the first state variables "Trip_mem_Q2" and "Trip_mem_Q3" pass to the active state shortly after the time $t'1$ and are kept in memory even during the interruption of the electric supply. "Trip_mem_Q2" is rapidly reset since the state variable "sel_mem_Q2" is in the active state.

Specifically, in practice, the input signal "sel_in" of the protection device may be activated at any moment during the countdown of the duration T4 and thus reset the corresponding variable "sel_mem".

On reconnection of the electric supply, the modules 22 restart at the time $t'_3$ and read the values of the first and second state variables stored in memory, for example in steps 116 and 120.

Shortly after the time $t'_3$, since the fault is present only downstream, the downstream module 22 activates the control signal "coil_Q3" to trigger and open the corresponding downstream protection device 20.

In contrast, by virtue of the selectivity, the trigger condition is inhibited in the upstream module 22 and the control signal "coil_Q2" remains inactive.

Figure 6:
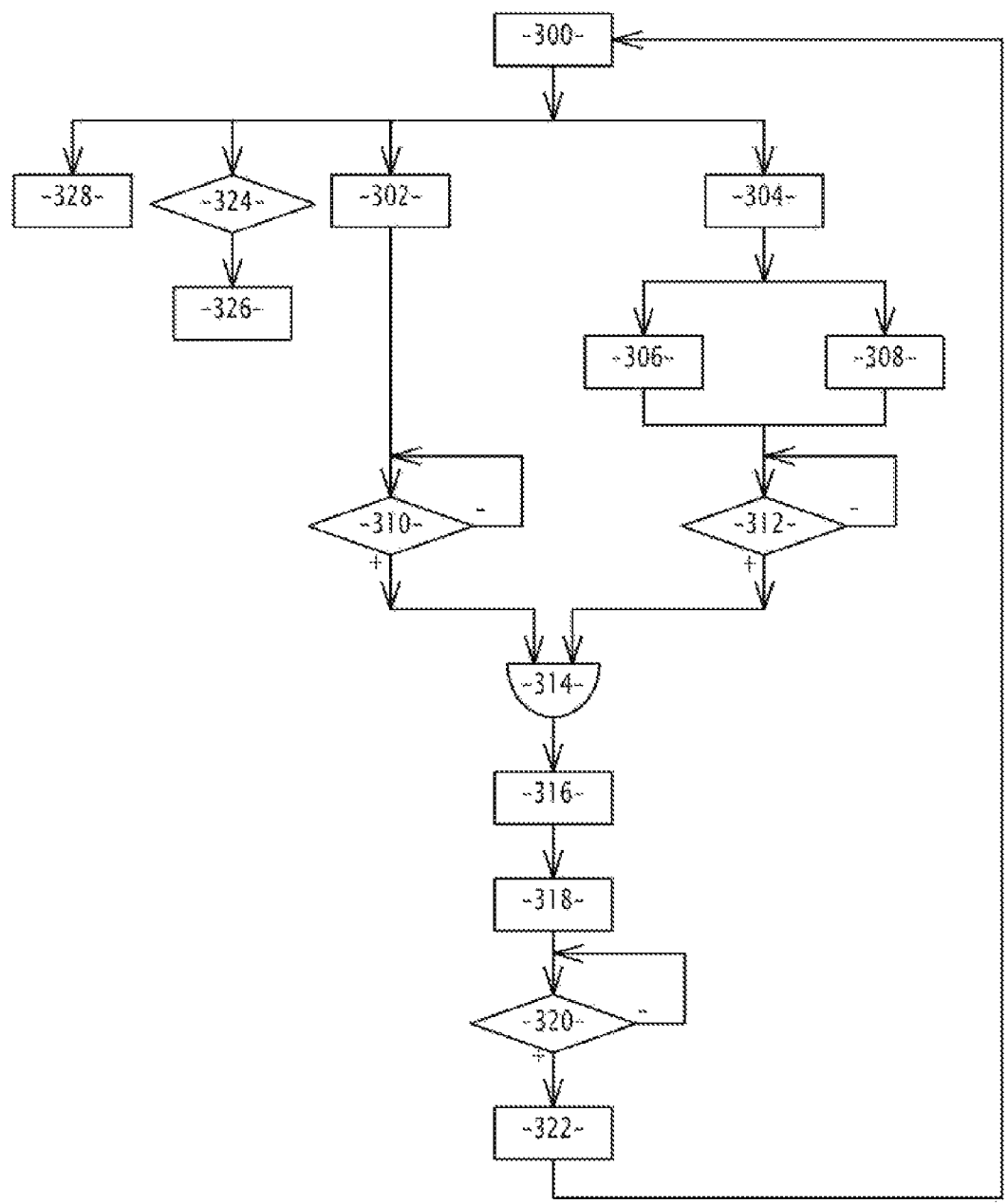
FIG. 6 is a flowchart of an example of a method of operation of the electronic monitoring module of FIG. 2 according to a second embodiment.

FIG. 6 shows a second embodiment of the invention. Elements of this embodiment that are analogous to those of the first embodiment have been given the same references and are not described in detail, in so far as the above description may be transposed thereto.

For example, this second embodiment may advantageously be implemented in grids using protection devices 20 that are of low-cost and/or that have a simplified design, especially for applications intended for the markets of developing countries and/or to equip already existing grids (retrofitting).

In particular, this second embodiment differs from the first embodiment in that, when a trigger condition is identified, the monitoring module does not trigger the protection device, but merely displays a warning, this nevertheless allowing the origin of the electric fault in the grid to be located and action to be taken accordingly. Moreover, the steps corresponding to the management of selectivity and to the storage in memory of the first and second state variables are omitted.

This embodiment especially comprises steps 300 to 314 that are similar to steps 108 to 110 and 132 to 134 described above, respectively.

Thus, the monitoring module 22, after it is turned on (step 300) measures an electric voltage (step 302) and an electric current (step 304) then calculates the first moving average (step 306) and the second moving average (step 308). The measured voltage value is compared with the predefined voltage threshold value (step 310) and the current value of the first moving average is compared with the current value of the second moving average (step 312) in order to identify a condition of trigger of the corresponding protection device 20 (step 314).

In particular, a condition of trigger of the protection device is identified when the measured voltage value is lower than the predefined voltage threshold value for a duration longer than a predefined duration threshold and when the current value of the first moving average is higher than the current value of the second moving average.

In parallel, if a fault has been stored in memory beforehand, this being checked in a step 324, then the module automatically emits a warning signal (step 326) for example analogously to step 156.

The warning signal may at any moment be manually reset by an operator, as illustrated by step 328. In this example, the implementation of the method is relatively simple and no automatic inspection of the actions taken by the operator to reset the warning signal is carried out.

Once the trigger condition has been identified, the module emits a warning signal and stores it in memory in a step 316 similar to step 156, then waits for the predefined duration T4 in a step 318 similar to step 140.

At the end of the countdown, in a step 320 similar to step 148, the monitoring module 22 automatically checks whether the measured electric voltage is still lower than (or equal to) the electric voltage threshold value.

If not, i.e. if the measured value of the electric voltage has again become higher than the electric voltage threshold value, then in a step 322 similar to step 164, the module 22 ceases to emit the warning signal and the memory of this alarm is reset.

In the contrary case, step 320 is repeated up to the expiry of the waiting time T4.

The embodiments and variants envisioned above may be combined together to form new embodiments.

The invention claimed is:

1. Method performed by an electronic monitoring module associated with an electric protection device, the method comprising:

measuring, repeatedly, a voltage and an electric current in an electric link with which said electric protection device is associated;

calculating, repeatedly, from measured values of current, a first moving average and a second moving average, the second moving average being calculated over a duration longer than the first moving average;

comparing a measured voltage value with a predefined voltage threshold value;

comparing the current value of the first moving average with the current value of the second moving average; and identifying a condition of trigger of the protection device when a measured voltage value is lower than the predefined voltage threshold value for a duration longer than a predefined duration threshold and when the current value of the first moving average is higher than the current value of the second moving average.

2. Method according to claim 1, further comprising emitting, by the electronic monitoring module, a warning signal when a trigger condition is identified.

3. Method according to claim 1, further comprising emitting, by the electronic monitoring module, a trigger signal intended for the protection device when a trigger condition is identified.

4. Method according to claim 1, further comprising, when a trigger condition is identified, storing in memory, by the electronic monitoring module, a state variable indicating the presence of a trigger condition and, from turn-on of the electronic monitoring module, identifying a trigger condition if the state variable stored in memory indicates the presence of a trigger condition.

5. Method according to claim 1, further comprising, when a trigger condition is identified, waiting for a predefined duration then measuring again a value of the electric voltage, and inhibiting the trigger condition if the measured value of the electric voltage is lower than the electric voltage threshold value.

6. Method according to claim 1, further comprising:

acquiring state information emitted by a second electronic monitoring module similar to said electronic monitoring module, the second electronic monitoring module being associated with a second protection device connected downstream of said protection device to the electric link; and inhibiting the trigger condition for said protection device if the acquired state information indicates that a trigger condition has been identified by the second electronic monitoring module for the second protection device.

7. Method according to claim 1, wherein the first moving average is calculated for a first duration shorter than or equal to 1 second, and preferably shorter than or equal to 500 ms and wherein the second moving average is calculated for a second duration longer than the first duration and preferably at least five times longer than the first duration, the second duration for example being shorter than or equal to 10 seconds, or shorter than or equal to 5 seconds.

8. System comprising an electric protection device and an electronic monitoring module associated with the electric protection device, the electronic monitoring module being configured to perform:

measuring, repeatedly, a voltage and an electric current in an electric link with which said electric protection device is associated;

calculating, repeatedly, from measured values of current, a first moving average and a second moving average, the second moving average being calculated over a duration longer than the first moving average;

comparing a measured voltage value with a predefined voltage threshold value;

comparing the current value of the first moving average with the current value of the second moving average; and identifying a condition of trigger of the protection device when a measured voltage value is lower than the predefined voltage threshold value for a duration longer than a predefined duration threshold and when the current value of the first moving average is higher than the current value of the second moving average.

9. System according to claim 8, wherein the electronic monitoring module is integrated into the protection device.

10. System according to claim 8, wherein the electronic monitoring module is separate from the protection device and mounted outside the protection device.

11. Electric distribution grid, comprising:

an electricity storage device and/or an electricity generation device, supplying a main link; and at least one electric load, connected to the main link via a system according to claim 8.

12. Electric distribution grid according to claim 11, wherein the electric distribution grid comprises a microgrid.

13. System according to claim 9, wherein the electronic monitoring module is implemented by an electronic tripping device of the protection device.

* * * * *